United States Patent
Kwon et al.

(10) Patent No.: US 10,312,303 B2
(45) Date of Patent: Jun. 4, 2019

(54) DISPLAY DEVICE AND METHOD OF MANUFACTURING THE SAME

(71) Applicant: Samsung Display Co., Ltd., Yongin, Gyeonggi-do (KR)

(72) Inventors: Jaejoong Kwon, Suwon-si (KR); Hayoung Lee, Seoul (KR); Seunghwan Chung, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 596 days.

(21) Appl. No.: 14/139,963

(22) Filed: Dec. 24, 2013

(65) Prior Publication Data
US 2015/0028739 A1 Jan. 29, 2015

(30) Foreign Application Priority Data
Jul. 25, 2013 (KR) .................. 10-2013-0088114

(51) Int. Cl.
*H05B 33/12* (2006.01)
*H05B 33/10* (2006.01)
*H01L 27/32* (2006.01)
*H01L 51/52* (2006.01)

(52) U.S. Cl.
CPC ...... *H01L 27/3244* (2013.01); *H01L 51/5262* (2013.01); *H01L 51/5271* (2013.01); *H01L 51/5275* (2013.01)

(58) Field of Classification Search
CPC .............................................. G02F 1/133606
See application file for complete search history.

(56) References Cited

U.S. PATENT DOCUMENTS

| 6,091,547 A * | 7/2000 | Gardiner ................... F21V 5/02 359/621 |
| 7,126,652 B2 | 10/2006 | Yokoyama et al. |
| 7,567,030 B2 | 7/2009 | Wano |
| 7,745,986 B2 | 6/2010 | Ito et al. |
| 7,758,973 B2 | 7/2010 | Baba et al. |
| 2007/0290607 A1 * | 12/2007 | Okada .................. G02B 5/1871 313/504 |
| 2009/0086466 A1 * | 4/2009 | Sugita ............... G02F 1/133615 362/97.2 |
| 2011/0110104 A1 * | 5/2011 | Kim et al. ................ F21V 7/00 362/341 |

(Continued)

FOREIGN PATENT DOCUMENTS

| JP | 2007-256493 A | 10/2007 |
| JP | 2011-108821 A | 6/2011 |

(Continued)

*Primary Examiner* — Nimeshkumar D Patel
*Assistant Examiner* — Jacob R Stern
(74) *Attorney, Agent, or Firm* — Cantor Colburn LLP

(57) ABSTRACT

A display device includes a base substrate, a plurality of pixels disposed on the base substrate, a light collecting member disposed on the plurality of pixels, and an encapsulation member disposed on the light collecting member and facing the base substrate to cover the plurality of pixels, where the light collecting member includes a light collecting layer including a protrusion pattern disposed on an upper surface of the light collecting layer and the protrusion pattern is protruded in one direction to change an optical path of a light passing through the light collecting layer.

10 Claims, 13 Drawing Sheets

(56) References Cited

U.S. PATENT DOCUMENTS

2012/0234460 A1 9/2012 Zhang et al.
2013/0051032 A1 2/2013 Jones et al.

FOREIGN PATENT DOCUMENTS

| JP | 2012181550 A | * | 9/2012 |
| KR | 1020100041314 A | | 4/2010 |
| KR | 1020100136222 A | | 12/2010 |

* cited by examiner

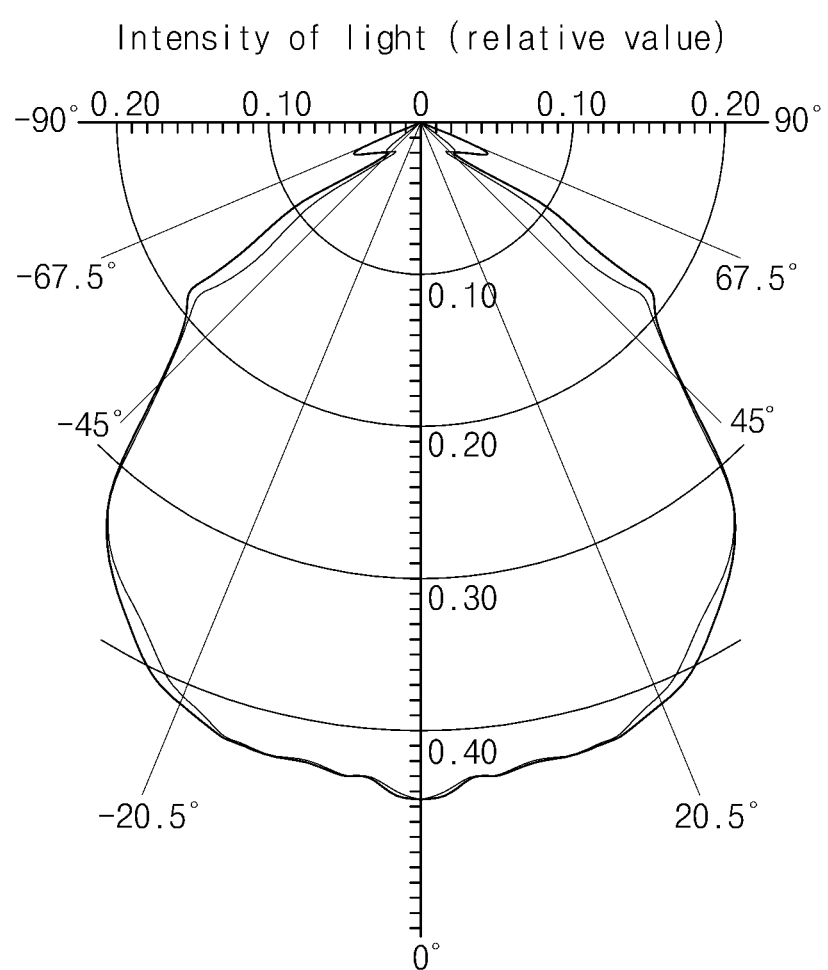

DISPLAY DEVICE AND METHOD OF MANUFACTURING THE SAME

This application claims priority to Korean Patent Application No. 10-2013-0088114, filed on Jul. 25, 2013, and all the benefits accruing therefrom under 35 U.S.C. § 119, the contents of which are hereby incorporated by reference in their entirety.

BACKGROUND

1. Field

The invention relates to a display device and a method of manufacturing the same. More particularly, the invention relates to a display device having high front surface brightness and a method of manufacturing the display device.

2. Description of the Related Art

A flat panel display device is generally classified into a light emission type and a light receiving type. As the light emission type display device, a plasma display panel and an electroluminescent display device, for example, are used. As the light receiving type, a liquid crystal display device, for example, is used. Among them, the electroluminescent display device has been spotlighted as a next generation display device since it has properties, such as fast response speed, low driving voltage, thin thickness, etc., for example. The electroluminescent display device is classified into an inorganic electroluminescent display device and an organic electroluminescent display device depending on a material used to form a light emitting layer.

The organic electroluminescent display device is a self-emissive display device that electrically excites a fluorescent organic compound to emit light. The organic electroluminescent display device has been spotlighted as a next generation display device since it has properties, such as fast response speed, low driving voltage, thin thickness, etc., for example, when compared to the liquid crystal display device.

The organic electroluminescent display device includes a light emitting layer formed of an organic material and disposed between an anode electrode and a cathode electrode. When positive and negative voltages are respectively applied to the electrodes, a hole is injected into the light emitting layer through a hole transport layer and an electron is injected into the light emitting layer through an electron transport layer. The holes and the electrons are recombined in the light emitting layer to generate an exciton. The light emitting layer emits light when an excited state of the exciton changes to a ground state, thereby an image is displayed.

SUMMARY

Exemplary embodiments of the invention provide a display device including a base substrate, a plurality of pixels disposed on the base substrate, a light collecting member disposed on the plurality of pixels, and an encapsulation member disposed on the light collecting member and facing the base substrate to cover the plurality of pixels. The light collecting member includes a light collecting layer including a protrusion pattern disposed on an upper surface thereof and the protrusion pattern is protruded in one direction to change an optical path of a light passing therethrough.

In an exemplary embodiment, the protrusion pattern may include a plurality of prism mountains and the plurality of prism mountains are extended in a direction substantially in parallel to a surface of the base substrate. In an exemplary embodiment, each of the plurality of prism mountains may have a polygonal shape, a semi-circular shape, or a semi-oval shape when viewed in a cross-sectional view perpendicular to a surface of the base substrate and the direction.

In an exemplary embodiment, the light collecting member may further include a planarization layer disposed on the light collecting layer to cover the protrusion pattern. In an exemplary embodiment, the light collecting layer may have a refractive index different from a refractive index of the planarization layer, and the refractive index of the light collecting layer is greater than the refractive index of the planarization layer.

Exemplary embodiments of the invention provide a method of manufacturing a display device including disposing a plurality of pixels on a base substrate, disposing a light collecting member on the plurality of pixels, disposing an encapsulation member on the light collecting member, and providing a light collecting layer in the light collecting member where the light collecting layer includes a protrusion pattern disposed on an upper surface thereof and the protrusion pattern is protruded in one direction.

In an exemplary embodiment, the providing the light collecting layer in the light collecting member may include disposing a polymer resin layer on the plurality of pixels, disposing a mold having a preliminary pattern on the polymer resin layer, transferring the preliminary pattern to the polymer resin layer, which provides the protrusion pattern on the polymer resin layer, and curing the polymer resin layer.

According to the above, the front brightness of the display device is enhanced.

BRIEF DESCRIPTION OF THE DRAWINGS

The above and other advantages of the invention will become readily apparent by reference to the following detailed description when considered in conjunction with the accompanying drawings, in which:

FIGS. 7A and 7B are graphs showing an exemplary embodiment of an intensity of light as a function of a viewing angle of a conventional display device and a display device according to the invention.

DETAILED DESCRIPTION

Figure 1:
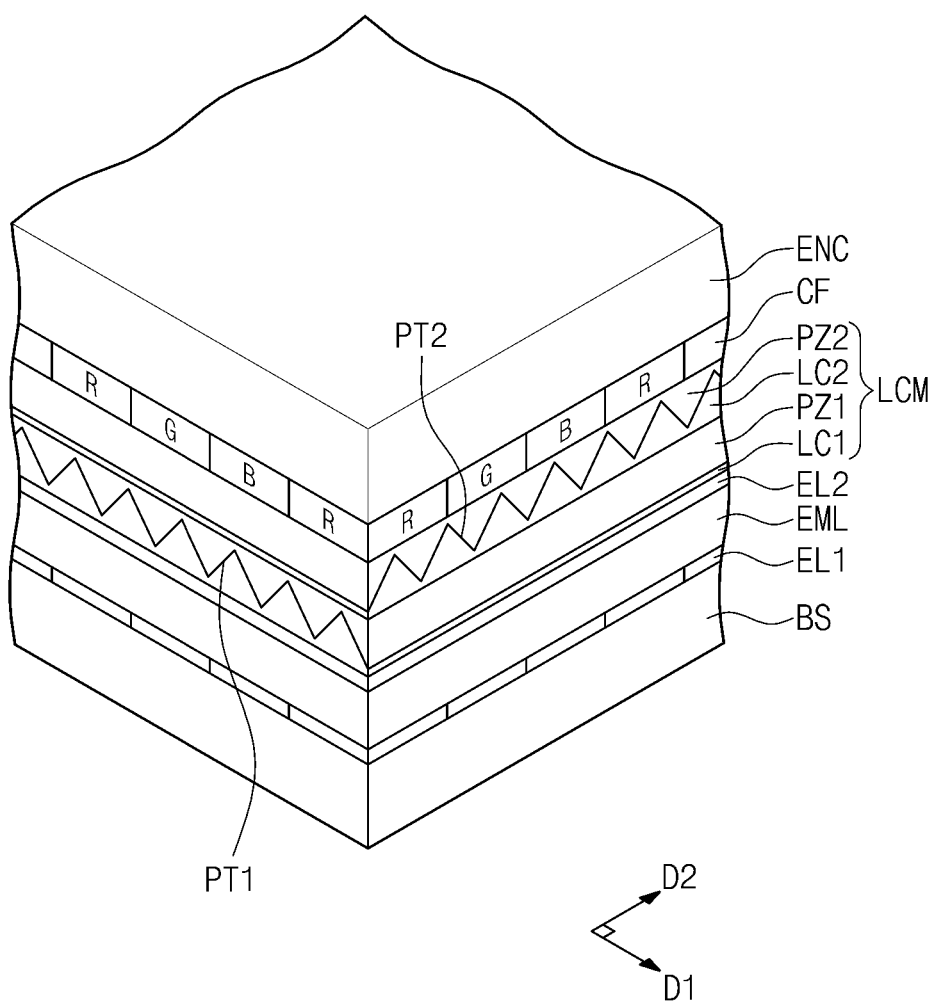
FIG. 1 is an exploded perspective view showing an exemplary embodiment of a display device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In an exemplary embodiment, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

Figure 2:
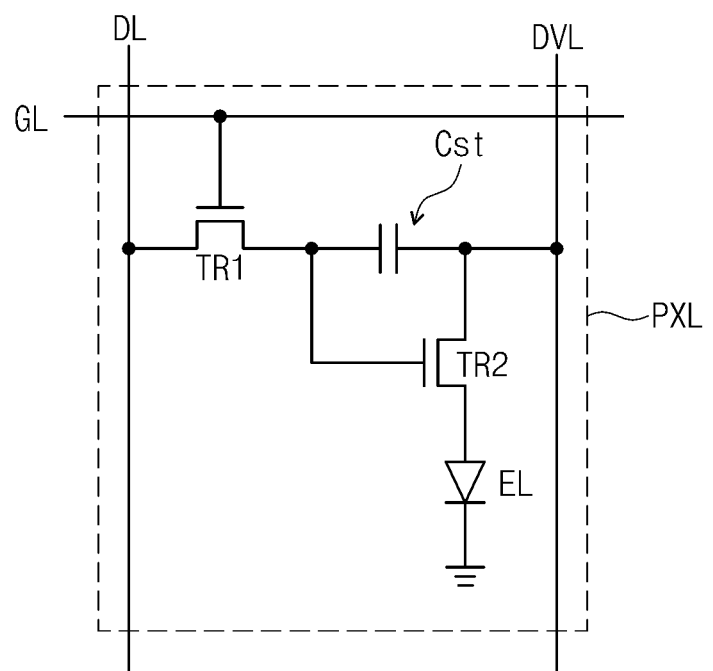
FIG. 2 is a circuit diagram showing one pixel.
Figure 3:
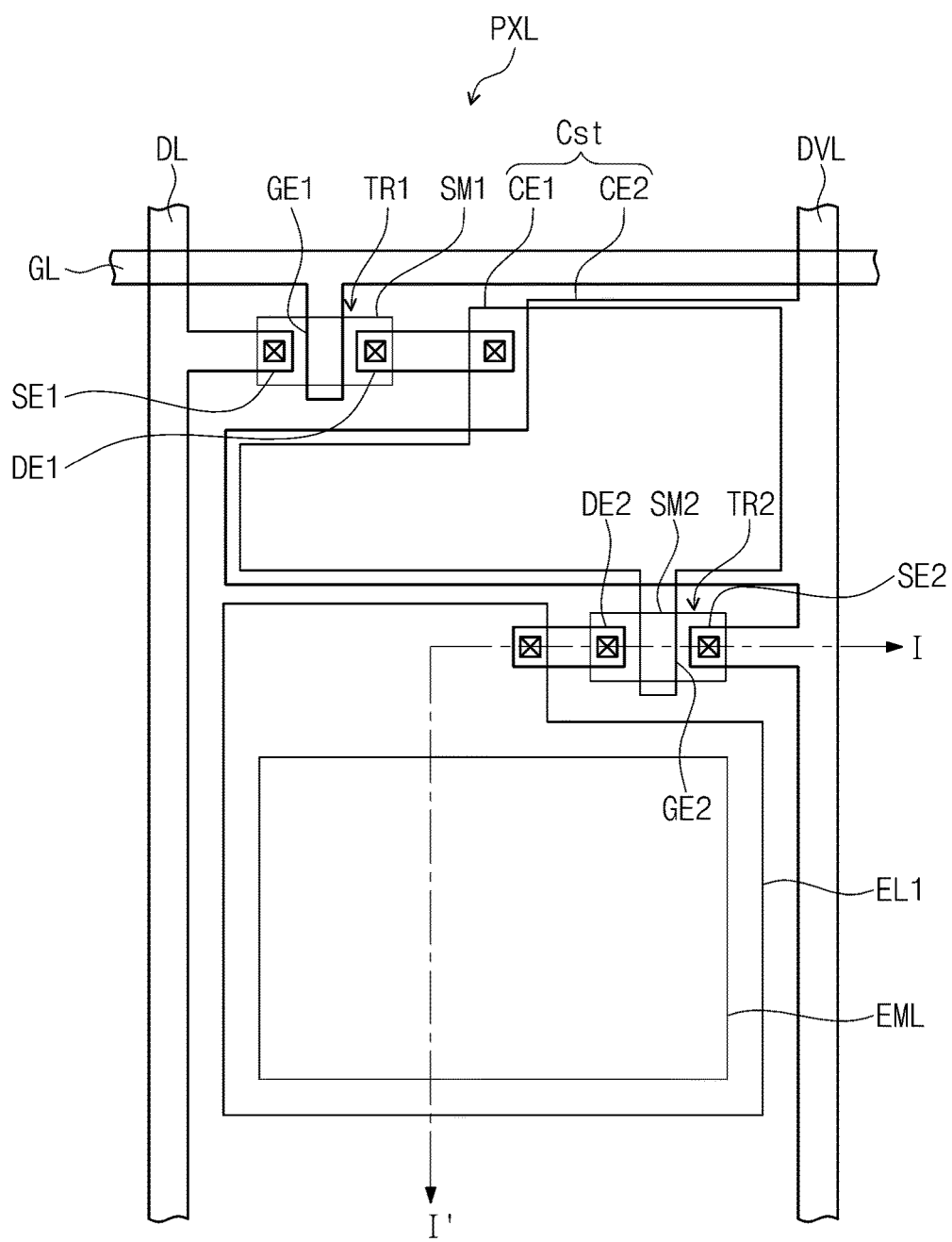
FIG. 3 is a plan view showing a pixel shown in FIG. 1.
Figure 4:
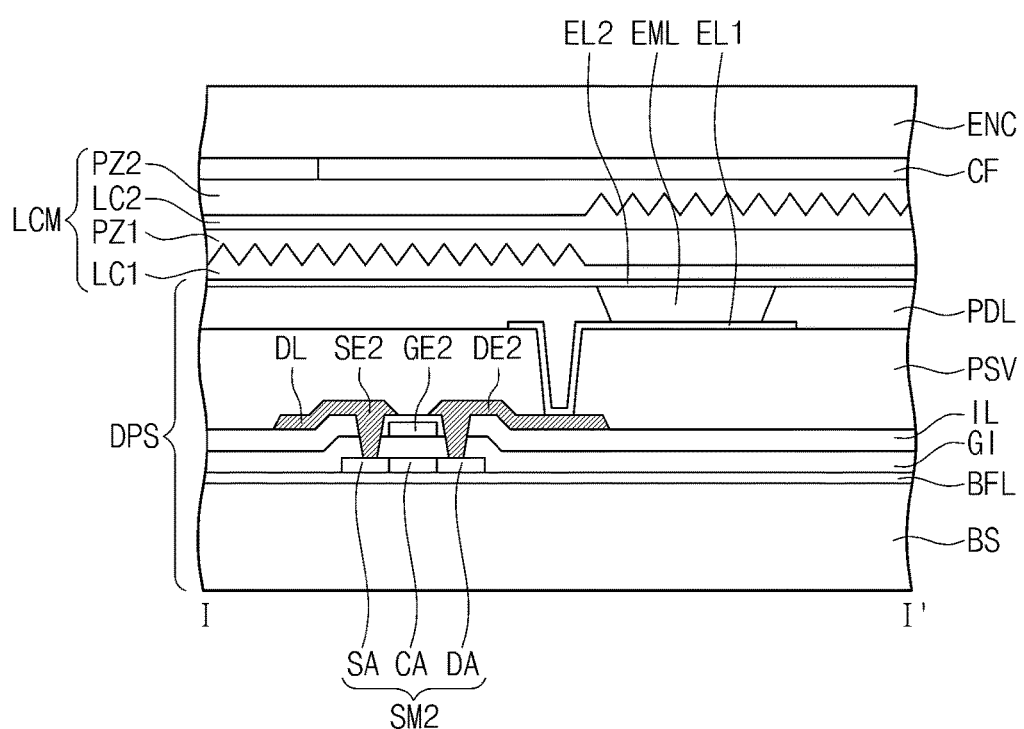
FIG. 4 is a cross-sectional view taken along line I-I' of FIG. 3.

FIG. 1 is an exploded perspective view showing a display device according to an exemplary embodiment of the invention, FIG. 2 is a circuit diagram showing one pixel, FIG. 3 is a plan view showing a pixel shown in FIG. 1, and FIG. 4 is a cross-sectional view taken along line I-I' of FIG. 3.

Referring to FIGS. 1 to 4, the display device is an organic light emitting display device including an organic light emitting layer. In the exemplary embodiment, for the convenience of explanation, a direction in which an image is displayed on the display panel and at which a user is present will be referred to an upward direction or a forward direction, and a direction opposite to the upward direction will be referred to a downward direction or a backward direction, but they should not be limited thereto or thereby.

The display device includes a base substrate BS, pixels PXL, a light collecting member LCM, a color filter CF, and an encapsulation member ENC.

In an exemplary embodiment, the base substrate BS has a rectangular plate shape with long sides and short sides. The pixels PXL are arranged on the base substrate BS in a matrix form.

Referring to FIG. 2, the pixel PXL includes a line part configured to include a gate line GL, a data line DL and a driving voltage line DVL, a thin film transistor ("TFT") connected to the line part, an organic light emitting device EL connected to the TFT and a capacitor Cst.

The gate line GL is extended in one direction. The data line DL is extended in another direction crossing the gate line GL. The driving voltage line DVL is extended in a direction substantially in parallel to the data line DL. The gate line GL applies a scan signal to the TFT, the data line DL applies a data signal to the TFT, and the driving voltage line DVL applies a driving voltage to the TFT.

The TFT includes a driving TFT TR2 to control the organic light emitting device EL and a switching TFT TR1 to switch the driving TFT TR2. In the illustrated exemplary embodiment, one pixel PXL includes two TFTs TR1 and TR2, but a number of the TFTs should not be limited to two. That is, one pixel PXL may include one TFT and one capacitor, or three or more TFTs and two or more capacitors.

Referring to FIG. 3, the switching TFT TR1 includes a first gate electrode GE1, a first source electrode SE1 and a first drain electrode DE1 The first gate electrode GE1 is connected to the gate line GL and the first source electrode SE1 is connected to the data line DL. The first drain electrode DE1 is connected to a gate electrode (i.e., a second gate electrode GE2) of the driving TFT TR2. The switching TFT TR1 transmits the data signal applied to the data line DL to the driving TFT TR2 in response to the scan signal applied to the gate line GL.

The driving TFT TR2 includes the second gate electrode GE2, a second source electrode SE2 and a second drain electrode DE2. The second gate electrode GE2 is connected to the switching TFT TR1, the second source electrode SE2 is connected to the driving voltage line DVL, and the second drain electrode DE2 is connected to the organic light emitting device EL.

Referring to FIG. 4, the organic light emitting device EL includes a light emitting layer EML, a first electrode EL1, and a second electrode EL2 facing the first electrode EL1 while interposing the light emitting layer EML between the first and second electrodes EL1 and EL2. The first electrode EL1 is connected to the second drain electrode DE2 of the driving TFT TR2. The second electrode EL2 receives a common voltage, and the light emitting layer EML emits a light in response to an output signal of the driving TFT TR2 to display an image. In an exemplary embodiment, the light emitted from the light emitting layer EML may be a white light.

Referring to FIGS. 2 and 3, the capacitor Cst is connected between the second gate electrode GE2 and the second source electrode SE2 of the driving TFT TR2 and charged with the data signal applied to the second gate electrode GE2 of the driving TFT TR2 to maintain the data signal applied to the second gate electrode GE2.

Referring to FIGS. 3 and 4, the light collecting member LCM is disposed on the pixels PXL and collects the light exiting from the pixels PXL in the upward direction. The light collecting member LCM includes a transparent material. The light collecting member LCM may include a light collecting layer on which a convex pattern is provided to change an optical path of the light passing through the light collecting layer. The light collecting layer LCM will be described in detail later.

The color filters CF are provided to correspond to the pixels PXL in a one-to-one correspondence to allow the pixels PXL to represent colors. The color filters CF include color filters displaying different colors from each other. In an exemplary embodiment, the color filters CF include a red color filter, a green color filter, and a blue color filter, which respectively display red, green, and blue colors, for example. In an exemplary embodiment, the color filters CF may further include color filters, which display a cyan color, a magenta color, a yellow color, a white color, etc.

In the illustrated exemplary embodiment, the white light exits from the pixels PXL and is changed to a color light, but it should not be limited thereto or thereby. In an exemplary embodiment, different color lights may exit from the pixels PXL, and thus the color filters CF may be omitted. In addition, the white light may exits from a portion of the pixels PXL and the color light may exit from the other portion of the pixels PXL. In this case, the color filters CF may be omitted or not according to the pixels PXL from which the white light or the color light exits.

The encapsulation member ENC is disposed on the color filters CF to seal the pixels PXL and the color filters CF.

Hereinafter, the display device according to the illustrated exemplary embodiment of the invention will be described.

In the display device, the base substrate BS includes areas in which the pixels PXL are disposed. The base substrate BS may include an insulating material, such as glass, plastic, and crystal.

A buffer layer BFL is disposed on the base substrate BS. The buffer layer BFL prevents impurities from being diffused into the switching TFT TR1 and the driving TFT TR2. The buffer layer BFL may include silicon nitride (SiNx), silicon oxide (SiOx) and silicon oxynitride (SiOxNy), and the buffer layer BFL may be omitted according to a material and a process condition of the base substrate BS.

A first semiconductor layer SM1 and a second semiconductor layer SM2 are provided on the buffer layer BFL. The first semiconductor layer SM1 and the second semiconductor layer SM2 include a semiconductor material and serve as an active layer of the switching TFT TR1 and the driving TFT TR2, respectively. Each of the first and second semiconductor layers SM1 and SM2 includes a source area SA, a drain area DA and a channel area CA provided between the source area SA and the drain area DA. Each of the first and second semiconductor layers SM1 and SM2 may include an inorganic semiconductor material or an organic semiconductor material. In an exemplary embodiment, the first and second semiconductor layers SM1 and SM2 may include oxide semiconductor, amorphous silicon semiconductor, crystalline silicon semiconductor or polycrystalline silicon semiconductor. In an exemplary embodiment, the oxide semiconductor includes oxide material having at least one of indium (In), gallium (Ga), zinc (Zn), tin (Sn), and any combinations thereof. In an exemplary embodiment, the first and second semiconductor layers SM1 and SM2 may include oxide semiconductor, such as zinc oxide ("ZnO"), tin oxide, indium oxide, indium-zinc oxide ("IZO"), indium-tin oxide ("ITO"), indium-gallium-zinc oxide, indium-zinc-tin oxide, indium-gallium-zinc-tin oxide, etc. The source area SA and the drain area DA may be doped with an n-type impurity or a p-type impurity.

A gate insulating layer GI is disposed on the first and second semiconductor layers SM1 and SM2.

The first gate electrode GE1 connected to the gate line GL and the second gate electrode GE2 are disposed on the gate insulating layer GI. The first gate electrode GE1 and the second gate electrode GE2 are provided to cover an area corresponding to the channel area CA of the first semiconductor layer SM1 and the second semiconductor layer SM2, respectively.

An inter-insulating layer IL is disposed on the first and second gate electrodes GE1 and GE2 to cover the first and second gate electrodes GE1 and GE2. The first source electrode SE1, the first drain electrode DE1, the second source electrode SE2, and the second drain electrode DE2 are disposed on the inter-insulating layer IL. The first source electrode SE1 and the first drain electrode DE1 respectively make contact with the source area SA and the drain area DA of the first semiconductor layer SM1 through contact holes defined through the gate insulating layer GI and the inter-insulating layer IL. The second source electrode SE2 and the second drain electrode DE2 respectively make contact with the source area SA and the drain area DA of the second semiconductor layer SM2 through contact holes defined through the gate insulating layer GI and the inter-insulating layer IL.

A portion of the second gate electrode GE2 and a portion of the driving voltage line DVL respectively correspond to a first capacitor electrode CE1 and a second capacitor electrode CE2 to provide the capacitor Cst in cooperation with the inter-insulating IL disposed between the portions of the second gate electrode GE2 and the driving voltage line DVL.

A passivation layer PSV is disposed on the first source electrode SE1, the first drain electrode DE1, the second source electrode SE2 and the second drain electrode DE2.

In an exemplary embodiment, the passivation layer PSV may include an inorganic insulating material, e.g., silicon nitride (SiNx), silicon oxide (SiOx), etc.

The first electrode EL1 is disposed on the passivation layer PSV as a cathode of the organic light emitting device EL. The first electrode EL1 is connected to the second drain electrode DE2 of the driving TFT TR2 through a contact hole defined through the passivation layer PSV.

One of the first electrode EL1 and the second electrode EL2 may be used as the anode and the other of the first electrode EL1 and the second electrode EL2 may be used as the cathode. Positions and materials of the anode and the cathode may be determined depending on a display direction. Hereinafter, the first electrode EL1 and the second electrode EL2 will be described as the cathode and the anode, respectively, but they should not be limited thereto or thereby.

In an exemplary embodiment, the first electrode EL1 may include a material having a lower work function, such as metal, metal alloy, electric conductive compound, and a combination thereof. In the exemplary embodiment, the first electrode EL1 includes lithium (Li), magnesium (Mg), aluminum (Al), aluminum-lithium (Al—Li), calcium (Ca), magnesium-indium (Mg—In), magnesium-silver (Mg—Ag), etc., for example A pixel definition layer PDL is disposed on the base substrate BS, on which the first electrode EL1 is disposed, to partition the pixel area into plural areas respectively corresponding to the pixels PXL. The pixel definition layer PDL is protruded from the base substrate BS along the circumference of the pixels PXL to expose an upper surface of the first electrode EL1.

The light emitting layer EML is disposed in the pixel area surrounded by the pixel definition layer PDL, and the second electrode EL2 is disposed on the light emitting layer EML.

In the exemplary embodiment, the light emitting layer EML emits the white light. The light emitting layer EML may include various light emitting materials including a host and a dopant. In an exemplary embodiment, as the dopant, a fluorescent dopant and a phosphorescent dopant may be used. In an exemplary embodiment, as the host, for example, Alq3C CBP(4,4'-N,N'-dicarbazole-biphenyl), 9,10-di(naphthalen-2-yl)anthracen(ADN), distyrylarylene ("DSA") or any combinations thereof may be used, however, it should not be limited thereto or thereby. According to another exemplary embodiment, the light emitting layer EML may emit the color light, and in this case, at least a portion of the color filters CF may be omitted.

In an exemplary embodiment, the second electrode EL2 may include a material having a higher work function. In a case that the image is provided to the upward direction of the base substrate BS, the second electrode EL2 may include a transparent conductive layer, such as ITO, IZO, ZnO, indium tin zinc oxide ("ITZO"), etc.

In an exemplary embodiment, an electron injection layer and an electron transport layer may be disposed between the first electrode EL1 and the light emitting layer EML, and a hole injection layer and a hole transport layer may be disposed between the light emitting layer and the second electrode EL2.

The sealing layer ENC is disposed on the color filters CF to seal the pixels PXL and the color filters CF.

Figure 5:
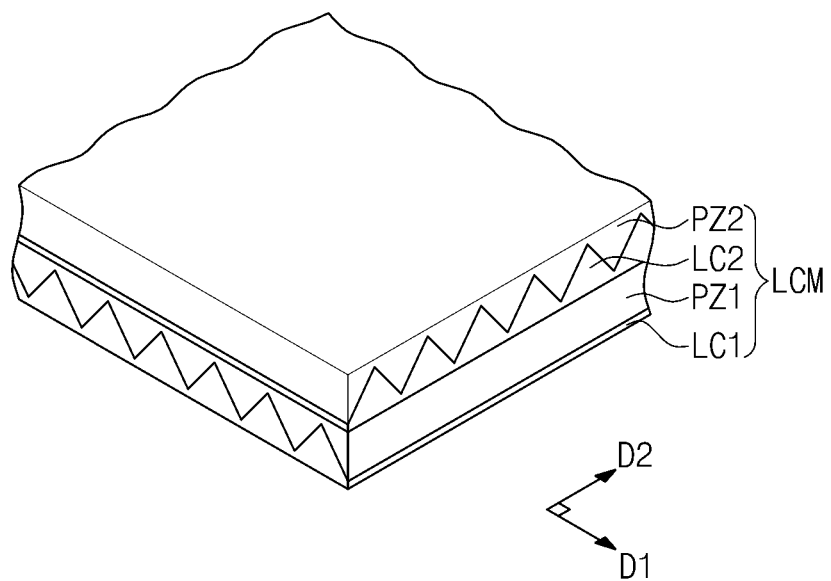
FIG. 5 is a perspective view showing an exemplary embodiment of a light collecting member according to the invention.

FIG. 5 is a perspective view showing the light collecting member LCM according to an exemplary embodiment of the invention. Hereinafter, the light collecting member LCM will be described in detail with reference to FIGS. 1 and 5.

The light collecting member LCM is disposed on the pixels PXL. In the illustrated exemplary embodiment (refer to FIG. 1), the light collecting member LCM is directly disposed on the second electrode EL2, but it should not be limited thereto or thereby. According to exemplary embodiments, an additional layer may be disposed between the second electrode and the light collecting member LCM.

The light exiting from the pixels PXL transmits through the light collecting member LCM and is collected in the upward direction, i.e., a direction substantially vertical to an upper surface of the base substrate BS (a forward direction to the user).

The light collecting member LCM has a single-layer structure or a multi-layer structure.

When the light collecting member LCM has the single-layer structure, the light collecting member LCM is configured to include one light collecting member LCM and provided with a protrusion pattern protruded from one surface of the light collecting member LCM to change the optical path of the light passing through the light collecting member LCM. The protrusion pattern is protruded to the upward direction or the downward direction.

When the light collecting member LCM has the multi-layer structure, at least one layer of the light collecting member LCM serves as the light collecting layer provided with the protrusion pattern. That is, the light collecting member LCM includes at least one light collecting layer. The light collecting member LCM further includes a planarization layer disposed on the light collecting layer to cover the protrusion pattern, and thus the upper surface of the light collecting layer is planarized. When the light collecting member LCM has the multi-layer structure including two or more light collecting layers, the protrusion pattern disposed on one of the light collecting layer may be overlapped with the protrusion pattern disposed on the other of the light collecting layer. In an exemplary embodiment, each light collecting layer includes a polymer resin, e.g., polyacrylate, polycarbonate, polyurethane, etc., for example.

In the illustrated exemplary embodiment, the light collecting member LCM has the multi-layer structure. The light collecting member LCM is disposed on the pixels PXL and includes a first light collecting layer LC1 having a first protrusion pattern PT1, a first planarization layer PZ1 disposed on the first light collecting layer LC1, a second light collecting layer LC2 disposed on the first collecting layer LC1 and having a second protrusion pattern PT2, and a second planarization layer PZ2 disposed on the second light collecting layer LC2.

The first protrusion pattern PT1 and/or the second protrusion pattern PT2 may be, but not limited to, prism mountains. In the exemplary embodiment, each prism mountain is extended in one direction. In an exemplary embodiment, each prism mountain is extended in the direction substantially in parallel to one of two pairs of sides of the base substrate BS, extended in a direction inclined to one side of the base substrate BS, extended in a zigzag manner with respect to one side of the base substrate BS, or extended along an imaginary curved line, for example.

In exemplary embodiments, each prism mountain may have various shapes, e.g., a polygonal shape including a triangular shape, a semi-circular shape, a semi-oval shape, etc., in a cross-sectional view vertical to a direction in which the protrusion pattern is extended.

The first protrusion pattern PT1 and the second protrusion pattern PT2 have the same shape or different shapes. Ian an exemplary embodiment, as shown in FIGS. 1 and 5, the first protrusion pattern PT1 and the second protrusion pattern PT2 have the triangular shape in the cross-sectional view, for example. According to another exemplary embodiment, the first protrusion pattern PT1 has the triangular shape in the cross-sectional view and the second protrusion pattern PT2 has the semi-circular shape in the cross-sectional view.

In an exemplary embodiment, the first protrusion pattern PT1 and the second protrusion pattern PT2 may be extended in different directions. In detail, when assuming that one of the long side and the short side of the base substrate BS is a first direction D1, the first protrusion pattern PT1 is extended in the first direction D1 and the second protrusion pattern PT2 is extended in a second direction D2 crossing the first direction D1. In the illustrated exemplary embodiment, the second direction D2 may be substantially vertical to the first direction D1.

In the exemplary embodiment, the light collecting layer has a refractive index different from that of the planarization layer and the refractive index of the light collecting layer is greater than the refractive index of the planarization layer. That is, the first light collecting layer LC1 and the first planarization layer PZ1 have different refractive indices from each other and the second light collecting layer LC2 and the second planarization layer PZ2 have different refractive indices from each other. As a difference in the refractive index between the first light collecting layer LC1 and the first planarization layer PZ1 becomes large, the change in path of the light is intensified at an interface between the first light collecting layer LC1 and the first planarization layer PZ1. In addition, as a difference in the refractive index between the second light collecting layer LC2 and the second planarization layer PZ2 becomes large, the change in path of the light is intensified at an interface between the second light collecting layer LC2 and the second planarization layer PZ2. The first and second light collecting layers LC1 and LC2 may include the same material and the first and second planarization layers PZ1 and PZ2 may include the same material.

In the illustrated exemplary embodiment, the light collecting member LCM includes two light collecting layers, but the number of the light collecting layers should not be limited thereto or thereby. That is, the light collecting member LCM may include one or three or more light collecting layers.

The light travels passing through the light collecting layer is refracted or reflected at the interface between the protrusion pattern and the planarization layer due to the refractive index difference, and thus the amount of the light traveling in the upward direction, i.e., the direction substantially vertical to the surface of the base substrate BS, is increased. In exemplary embodiments of the invention, the shape, extension direction and density of the protrusion pattern may be controlled to allow the brightness corresponding to about 50 percent (%) of a maximum brightness of the display device exists in the angle of about −60 degrees to about 60 degrees, i.e., about 120 degrees in left and right directions or in up and down directions, with respect to a normal line (about 0 degree) of the surface of the base substrate BS.

The display device having the above-mentioned structure may be manufactured by disposing the pixels PXL on the base substrate BS, disposing the light collecting member LCM on the pixels PXL, disposing a color filter CF on the light collecting member LCM, and disposing the encapsulation member ENC on the color filter CF.

Hereinafter, a method of manufacturing the display device will be described in detail with reference to FIGS. 6A to 6G.

FIGS. 6A to 6G are cross-sectional views showing the method of manufacturing the display device according to an exemplary embodiment of the invention. For the convenience of explanation, portions of the elements of the display device, e.g., the base substrate, the pixels, etc., will be omitted, and the light collecting member LCM will be mainly described.

Figure 6A:
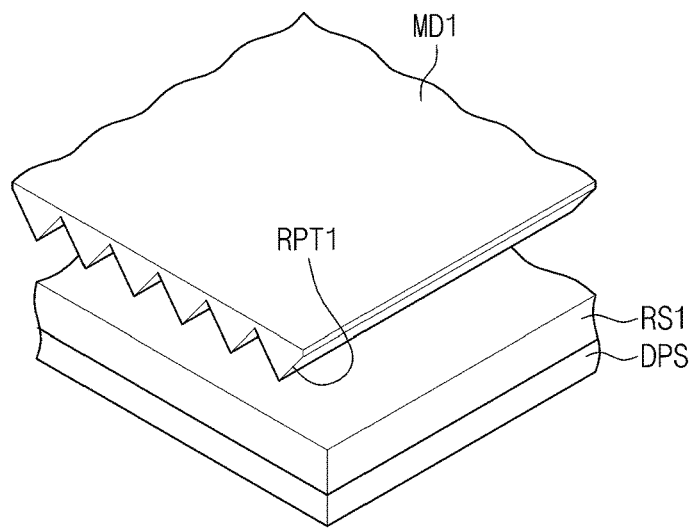
FIGS. 6A to 6G are cross-sectional views showing an exemplary embodiment of a method of manufacturing a display device according to the invention.

Referring to FIG. 6A, the line part (not shown), the TFT (not shown), the first electrode (not shown), the pixel definition layer (not shown), the light emitting layer (not shown), and the second electrode (not shown) are disposed on the base substrate. For the convenience of explanation, the base substrate, the line part, the TFT, the first electrode, the pixel definition layer, the light emitting layer, and the second electrode have been shown in the display substrate DPS.

The line part and the TFT are provided by a photolithography process using a mask. The first electrode is provided by depositing a conductive material on the base substrate on which the line part and the TFT are disposed and patterning the conductive material using a photolithography process. The pixel definition layer is provided by disposing a photosensitive organic layer on the base substrate on which the first electrode is disposed, patterning the photosensitive organic layer using a mask, and curing the patterned photosensitive organic layer. The light emitting layer is disposed on the base substrate on which the first electrode and the pixel definition layer are disposed. The light emitting layer is provided on the base substrate in a fluid state and provided by removing a solvent from the light emitting layer. The light emitting layer may be provided on the base substrate by a printing method, e.g., an inkjet method, a coating method using a nozzle, etc. The second electrode is disposed on the light emitting layer.

Referring to FIG. 6A again, a first resin RS1 is coated on the display substrate DPS. The first resin RS1 includes a light-curable polymer resin. In the exemplary embodiment, the first resin RS1 may be cured by an ultraviolet light UV.

A first mold MD1 having a first preliminary pattern RPT1 is disposed on the display substrate DPS coated with the first resin RS1. The first preliminary pattern RPT1 has a reverse shape to that of the first protrusion pattern PT1.

Figure 6B:
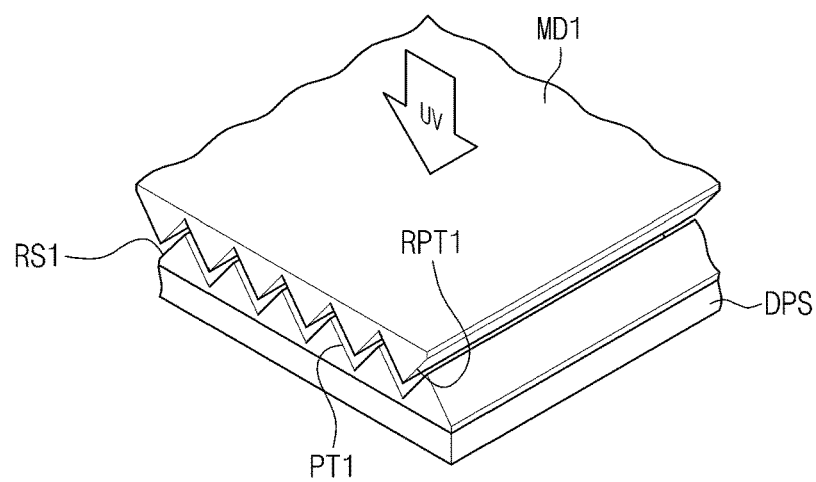

Referring to FIG. 6B, the first resin RS1 is pressurized by the first mold MD1 and the light UV is irradiated to the first resin RS1 while the first resin RS1 is pressurized by the first mold MD1. Thus, the first preliminary pattern RPT1 of the first mold MD1 is transferred to the first resin RS1.

Figure 6C:
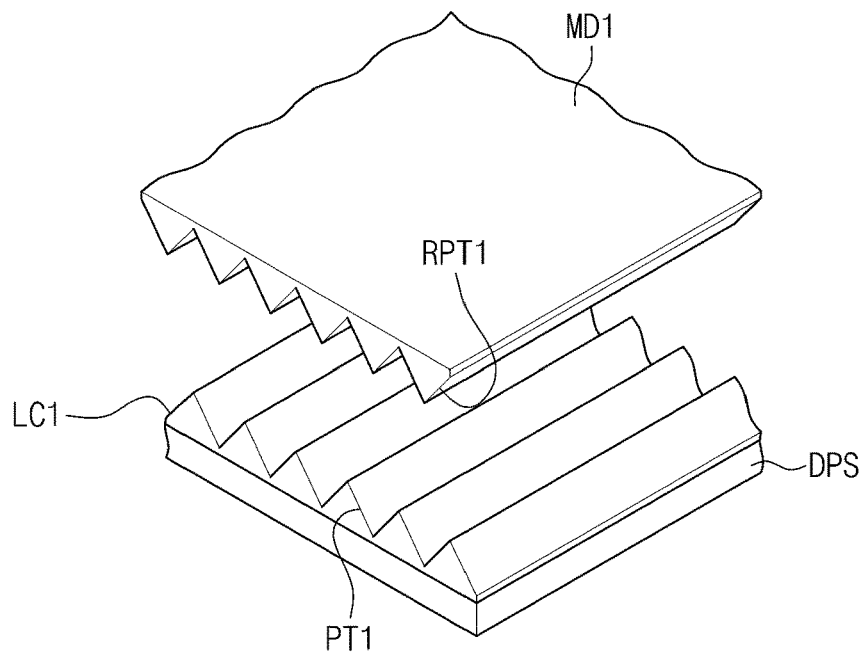

Referring to FIG. 6C, the first mold MD1 is removed, so that the first light collecting layer LC1 is provided.

Figure 6D:
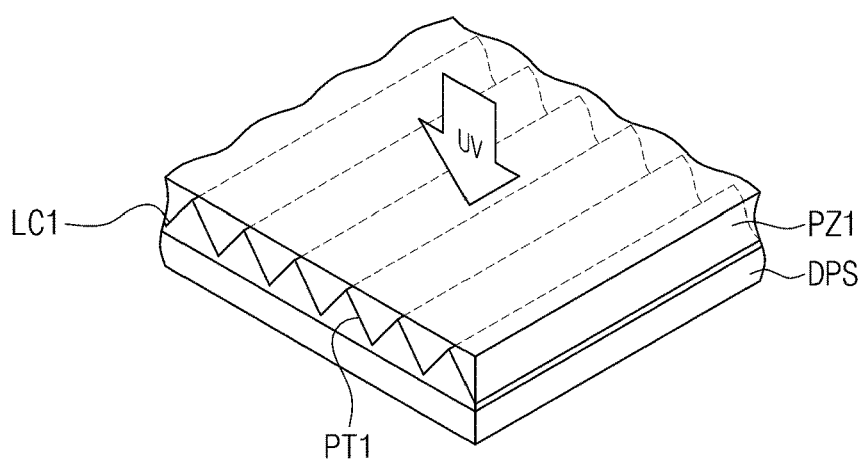

Referring to FIG. 6D, the first planarization layer PZ1 is disposed on the first light collecting layer LC1. The first planarization layer PZ1 includes a light-curable polymer resin and is provided by coating a planarization material on the first light collecting layer LC1 and irradiating the light to the planarization material. The light-curable material of the first light collecting layer LC1 has a refractive index different from a refractive index of the light-curable material of the first planarization layer PZ1. In an exemplary embodiment, the refractive index of the first light collecting layer LC1 is greater than the refractive index of the first planarization layer PZ1, for example.

Figure 6E:
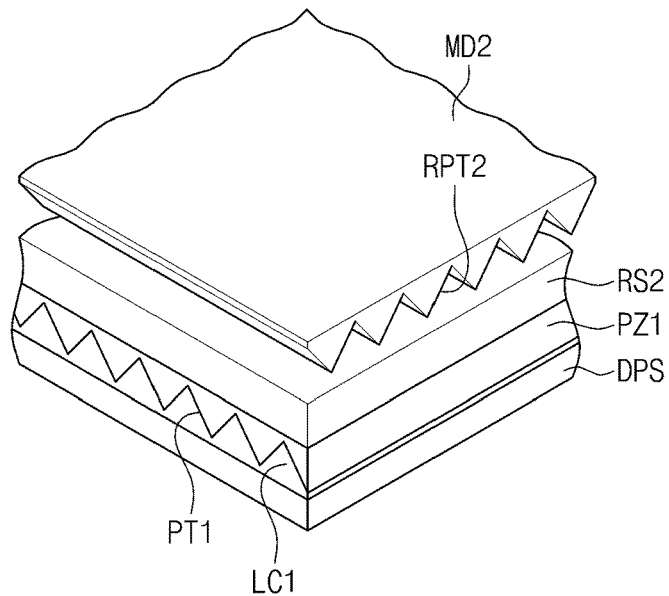

Referring to FIG. 6E, a second resin RS2 is coated on the display substrate DPS on which the first planarization layer PZ1 is disposed. A second mold MD2 having a second preliminary pattern RPT2 is disposed on the display substrate DPS coated with the second resin RS2. The second preliminary pattern RPT2 has a reverse shape to that of the second protrusion pattern PT2.

Figure 6F:
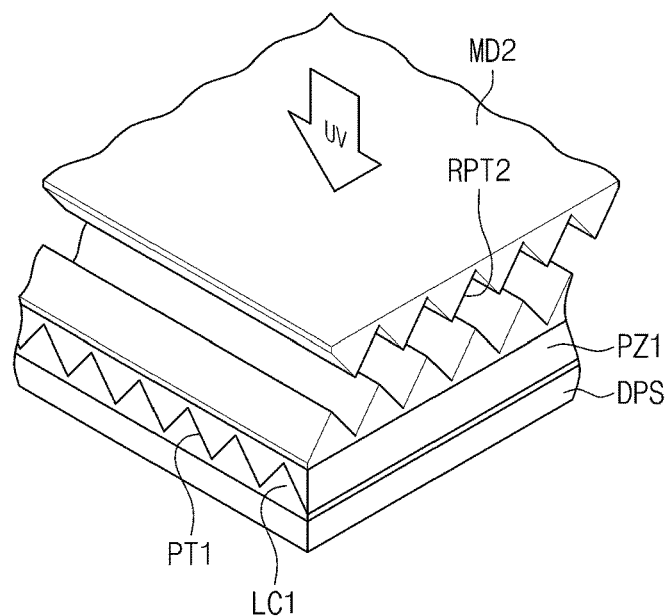

Referring to FIG. 6F, the second resin RS2 is pressurized by the second mold MD2 and the light UV is irradiated to the second resin RS2 while the second resin RS2 is pressurized by the second mold MD2. The second resin RS2 is cured while being pressurized by the second mold MD2, and thus the second preliminary pattern RPT2 of the second mold MD2 is transferred to the second resin RS2.

Then, the second mold MD2 is removed, and thus the second light collecting layer LC2 is provided.

Figure 6G:
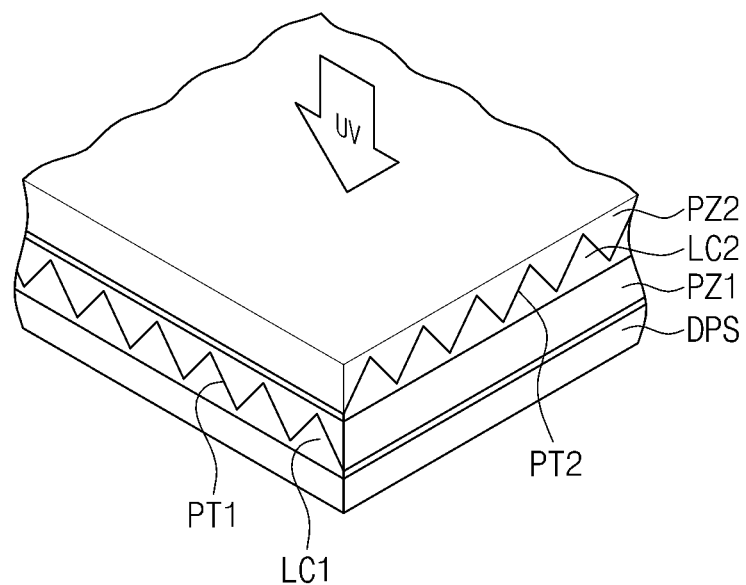

Referring to FIG. 6G, the second planarization layer PZ2 is disposed on the second light collecting layer LC2. The second polarization layer PZ2 includes a light-curable polymer resin and is provided by coating a planarization material on the second light collecting layer LC2 and irradiating the light to the planarization material. The light-curable material of the second light collecting layer LC2 has a refractive index different from a refractive index of the light-curable material of the second planarization layer PZ2. In an exemplary embodiment, the refractive index of the second light collecting layer LC2 is greater than the refractive index of the second planarization layer PZ2. In addition, the first light collecting layer LC1 and the second light collecting layer LC2 include the same material, and the first planarization layer PZ1 and the second planarization layer PZ2 include the same material.

According to another exemplary embodiment, the light collecting member LCM may include three or more light collecting layers and three or more planarizing layers. In this case, the above-mentioned processes are repeatedly performed.

Then, although not shown in figures, the color filter CF is disposed on the light emitting member LCM. The color filter CF is provided by using a photolithography process.

The encapsulation member ENC is disposed on the color filter. The encapsulation member ENC includes an organic insulating material and/or an inorganic insulating material. The encapsulation member ENC may be provided by various methods, e.g., deposition, coating, adhesion, etc.

In the display device having the above-mentioned structure, the light exiting from the light emitting layer travels to pass through the light collecting layer, and thus the light is refracted or reflected at the interface between the protrusion pattern and the planarization layer due to the refractive index difference. Therefore, the amount of the light traveling in the upward direction, i.e., the direction substantially vertical to the surface of the base substrate BS, is increased.

Figure 7A:
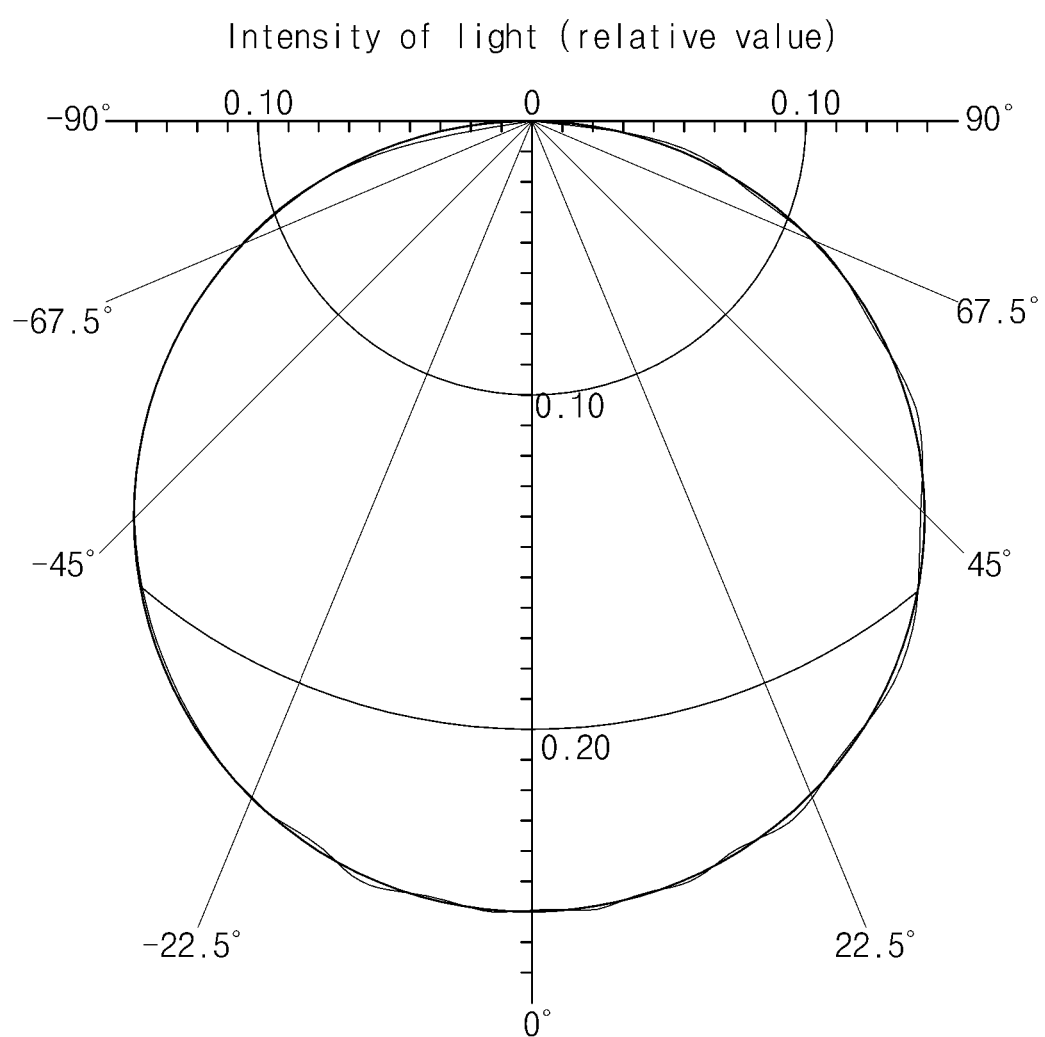

FIGS. 7A and 7B are graphs showing an intensity of light as a function of a viewing angle of a conventional display device and a display device according to an exemplary embodiment of the invention, respectively. In the graphs, the direction vertical to the surface of the base substrate is indicated as about 0 degrees, and the direction substantially in parallel to the surface of the base substrate is indicated as about 90 degrees. In the display devices shown in FIGS. 7A and 7B, all conditions are maintained at the same except for the light collecting member LCM is added to the display device according to the exemplary embodiment of the invention.

Referring to FIGS. 7A and 7B, the intensity of the light is increased on the upper portion of the base substrate in the exemplary embodiment of the display device according to the invention when compared to that of the conventional display device. In the conventional display device, a relatively uniform light is emitted according to the angle on the basis of the angles, but the intensity of the light is drastically increased in the upward direction of the base substrate in the present display device. In particular, according to the amount of the light in the conventional display device and the exemplary embodiment of the display device, when the angle is about 0 degrees, a luminous intensity of the light in the conventional display device is about 0.26 candelas and a luminous intensity of the light in the exemplary embodiment of the display device is about 0.45 candelas.

In addition, although not shown in graphs, the brightness is increased on the upper portion of the base substrate in the exemplary embodiment of the display device when compared to that of the conventional display device. The brightness of the conventional display device is about 90 nits, but the brightness of the exemplary embodiment of the display device is about 160 nits. That is, the brightness of the exemplary embodiment of the display device is improved by about 70 percent (%) compared with that of the conventional display device.

As described above, according to the display device of the invention, the intensity of the light and the brightness are improved in the direction substantially vertical to the display device. Accordingly, since the brightness of the image provided to the user is improved, the image may be clearly provided to the user when used outdoors in which an external light exists. In addition, since the brightness of the image is improved, the exemplary embodiment of the display device may provide the image with the same brightness as that of the conventional display device using a relatively low electric power compared to that of the conventional display device, thereby reducing power consumption of the exemplary embodiment of the display device. Further, when the light collecting property in a specific direction, e.g., the direction substantially vertical to the display device, is improved, the image may be provided to the user at a specific location.

In addition, the light collecting member LCM is able to be easily disposed on the display substrate through low temperature processes, e.g., a process of coating the polymer resin, a process of pressing the polymer resin with the mold, a process of curing the polymer resin, etc. Therefore, a high temperature process that exerts an influence on the pixels is omitted, and thus the light collecting member LCM is applied to a flexible display device.

In the exemplary embodiment, the light collecting member LCM is configured to include two light collecting layers, but the number of the light collecting layers should not be limited to two. According to another exemplary embodiment, the light collecting member LCM may include one or three or more light collecting layers. In addition, the planarization layer is disposed on the light collecting layer, but the planarization layer may be omitted.

In the case that the planarization layer is omitted, the encapsulation member may be directly disposed on the light collecting layer.

Figure 8A:
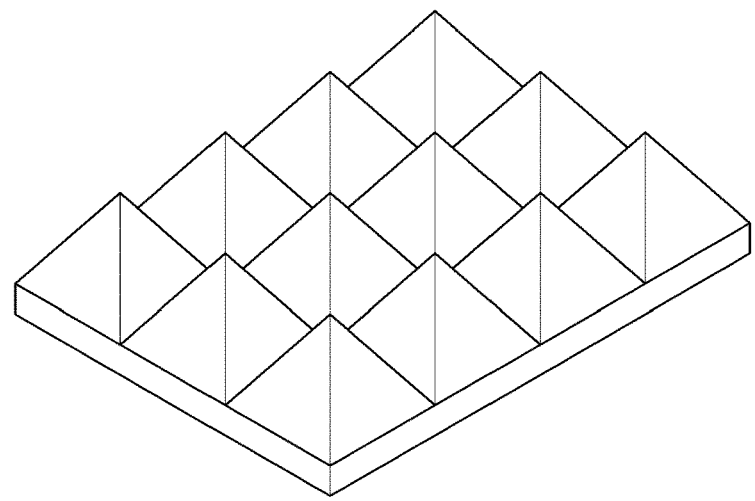
FIGS. 8A to 8C are perspective views showing exemplary embodiments of light collecting layers according to the invention.
Figure 8B:
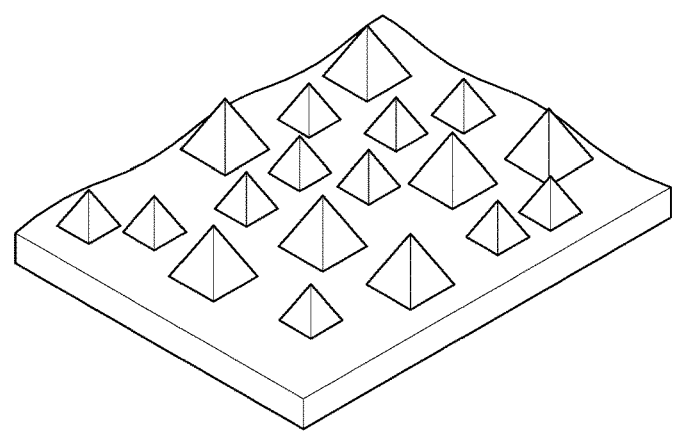
Figure 8C:
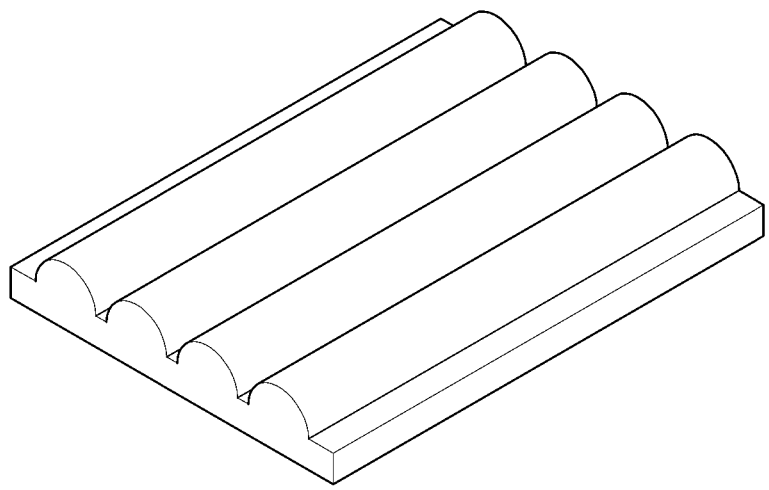

In the exemplary embodiment, the protrusion pattern has the triangular shape in the cross-sectional view, e.g., the prism mountain, but it should not be limited thereto or thereby. FIGS. 8A to 8C are perspective views showing light collecting layers according to exemplary embodiments of the invention.

Referring to FIG. 8A, the protrusion pattern disposed on the light collecting layer may include a plurality of pyramids having a same pyramid shape in a same density.

Referring to FIG. 8B, the protrusion pattern disposed on the light collecting layer may include a plurality of pyramids each having a pyramid shape. The pyramids have different sizes and are arranged in different densities depending areas of the light collecting layer.

Referring to FIG. 8C, the protrusion pattern disposed on the light collecting layer may have a plurality of semicircular shapes extended in one direction.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display device comprising:
   a base substrate;
   a plurality of pixels disposed on the base substrate to display an image directly, each of the pixels comprises an organic light emitting device;
   a light collecting member disposed on the plurality of pixels;
   an encapsulation member disposed on the light collecting member such that the light collecting member is disposed between the encapsulation member and the plurality of pixels; and
   a color filter disposed between the light collecting member and the encapsulation member,
   wherein the light collecting layer comprises,
   a first light collecting layer disposed on the plurality of pixels and having a first protrusion pattern, the first protrusion pattern being protruded from an upper surface of the first light collecting layer; and
   a second light collecting layer disposed on the first light collecting layer and having a second protrusion pattern, the second protrusion pattern being protruded from an upper surface of the second light collecting layer,
   wherein the first protrusion pattern is extended in a first direction substantially in parallel to a major surface defining the base substrate and is arranged along a second direction substantially in parallel to the major surface of the base substrate and crossing the first direction and the second protrusion pattern is extended in the second direction and is arranged along the first direction,
   wherein the first and the second protrusion patterns are protruded to change an optical path of a light which passes therethrough, and
   the first and the second light collecting layers comprise same material.

2. The display device of claim 1, wherein the protrusion pattern comprises a plurality of prism mountains.

3. The display device of claim 2, wherein the plurality of prism mountains are extended in a direction substantially in parallel to a surface of the base substrate.

4. The display device of claim 3, wherein each of the plurality of prism mountains has a polygonal shape, a semi-circular shape, or a semi-oval shape when viewed in a cross-sectional view perpendicular to the surface of the base substrate and the direction.

5. The display device of claim 1, wherein the light collecting member further comprises a planarization layer disposed on the light collecting layer to cover the protrusion pattern.

6. The display device of claim 5, wherein the light collecting layer has a refractive index different from a refractive index of the planarization layer.

7. The display device of claim 6, wherein the refractive index of the light collecting layer is greater than the refractive index of the planarization layer.

8. The display device of claim 6, wherein the refractive index of the light collecting layer is smaller than the refractive index of the planarization layer.

9. The display device of claim 1, wherein the first protrusion pattern and the second protrusion pattern are overlapped with each other when viewed in a plan view.

10. The display device of claim 1, wherein each of the plurality of pixels comprises:
    a first electrode disposed on the base substrate;
    a light emitting layer disposed on the first electrode; and
    a second electrode facing the first electrode while interposing the light emitting layer therebetween.

* * * * *